US009245767B2

(12) United States Patent
Francischetti et al.

(10) Patent No.: US 9,245,767 B2
(45) Date of Patent: Jan. 26, 2016

(54) ANNEAL MODULE FOR SEMICONDUCTOR WAFERS

(71) Applicant: APPLIED Materials, Inc., Santa Clara, CA (US)

(72) Inventors: Vincent Steffan Francischetti, Columbia Falls, MT (US); Gregory J. Wilson, Kalispell, MT (US); Kyle M. Hanson, Kalispell, MT (US); Paul Wirth, Kalispell, MT (US); Robert B. Moore, Lewistown, MT (US)

(73) Assignee: APPLIED Materials, Inc., Santa Clara, CA (US)

( * ) Notice: Subject to any disclaimer, the term of this patent is extended or adjusted under 35 U.S.C. 154(b) by 294 days.

(21) Appl. No.: 14/025,678

(22) Filed: Sep. 12, 2013

(65) Prior Publication Data

US 2015/0069043 A1 Mar. 12, 2015

(51) Int. Cl.
*H05B 3/68* (2006.01)
*F26B 19/00* (2006.01)
*H01L 21/324* (2006.01)
*H01L 21/67* (2006.01)
*H01L 21/677* (2006.01)

(52) U.S. Cl.
CPC .......... *H01L 21/324* (2013.01); *H01L 21/677* (2013.01); *H01L 21/67103* (2013.01); *H01L 21/67109* (2013.01); *H01L 21/67248* (2013.01); *H01L 21/67748* (2013.01)

(58) Field of Classification Search
CPC ...... H01L 21/324; H01L 21/67098–21/67115; H01L 21/67248; H01L 21/677; H01L 21/67739–21/67763

USPC .................. 219/443.1, 444.1; 392/416, 418; 118/725

See application file for complete search history.

(56) References Cited

U.S. PATENT DOCUMENTS

| 5,252,807 | A | 10/1993 | Chizinsky |
| 5,431,700 | A | 7/1995 | Sloan |
| 5,854,468 | A * | 12/1998 | Muka .......................... 219/444.1 |
| 6,072,163 | A | 6/2000 | Armstrong et al. |
| 6,136,163 | A | 10/2000 | Cheung et al. |
| 6,276,072 | B1 | 8/2001 | Morad et al. |
| 6,296,906 | B1 | 10/2001 | Stimmell et al. |
| 6,307,184 | B1 | 10/2001 | Womack et al. |
| 6,387,761 | B1 | 5/2002 | Shih et al. |

(Continued)

FOREIGN PATENT DOCUMENTS

| JP | 2001230201 A | 8/2001 |
| WO | 2004082820 A2 | 9/2004 |
| WO | 2011060212 A1 | 5/2011 |

OTHER PUBLICATIONS

European Patent Office, European Search Report in Application No. EP 14 18 3931 (Jan. 20, 2015).

*Primary Examiner* — Sang Y Paik
(74) *Attorney, Agent, or Firm* — Kenneth H. Ohriner; Perkins Coie LLP

(57) ABSTRACT

An anneal module for annealing semiconductor material wafers and similar substrates reduces particle contamination and oxygen ingress while providing uniform heating including for 500° C. processes. The anneal module may include a process chamber formed in a metal body having internal cooling lines. A hot plate has a pedestal supported on a thermal choke on the body. A gas distributor in the lid over the hot plate flows gas uniformly over the wafer. A transfer mechanism moves a hoop to shift the wafer between the hot plate and a cold plate.

20 Claims, 13 Drawing Sheets

(56) References Cited

U.S. PATENT DOCUMENTS

| | | |
|---|---|---|
| 6,423,947 B2 | 7/2002 | Womack et al. |
| 6,508,920 B1 | 1/2003 | Ritzdorf et al. |
| 6,529,686 B2 | 3/2003 | Ramanan et al. |
| 6,544,338 B1 | 4/2003 | Batchelder et al. |
| 6,639,189 B2 | 10/2003 | Ramanan et al. |
| 6,951,821 B2 * | 10/2005 | Hamelin et al. .............. 438/706 |
| 6,994,776 B2 | 2/2006 | Ritzdorf et al. |
| 7,311,810 B2 | 12/2007 | Mok et al. |
| 7,425,689 B2 * | 9/2008 | Kulp ......................... 219/444.1 |
| 7,575,986 B2 | 8/2009 | Olsen et al. |
| 7,642,171 B2 | 1/2010 | Ingle et al. |
| 7,704,327 B2 | 4/2010 | Waldhauer et al. |
| 7,980,003 B2 * | 7/2011 | Aoki et al. ...................... 34/549 |
| 2004/0209414 A1 | 10/2004 | Mok |
| 2007/0169373 A1 | 7/2007 | Aoki |
| 2008/0203083 A1 | 8/2008 | Wirth |

* cited by examiner

ANNEAL MODULE FOR SEMICONDUCTOR WAFERS

BACKGROUND OF THE INVENTION

Micro-electronic circuits and other micro-scale devices are generally manufactured from a substrate or wafer, such as a silicon or other semiconductor material wafer. Multiple metal layers are applied onto the substrate to form micro-electronic or other micro-scale components or to provide electrical interconnects. These metal layers, typically copper, are plated onto the substrate, and form the components and interconnects in a sequence of photolithographic, plating, etching, polishing or other steps.

To achieve desired material properties, the substrate is typically put through an annealing process where the substrate is quickly heated, usually to about 200-500° C. and more typically to about 300-400° C. The substrate may be held at these temperatures for a relatively short time, e.g., 60-300 seconds. The substrate is then rapidly cooled, with the entire process usually taking only a few minutes. Annealing may be used to change the material properties of the layers on the substrate. It may also be used to activate dopants, drive dopants between films on the substrate, change film-to-film or film-to-substrate interfaces, densify deposited films, or to repair damage from ion implantation.

As feature sizes for microelectronic devices and interconnects become smaller, the allowable defect rate decreases substantially. Defects result from contaminant particles, so that reducing particle generating elements in the anneal chamber will reduce defects. The temperature uniformity of the wafer is another significant design factor as it affects the crystalline structure of copper or other materials on the wafer. Another consideration is serviceability. It is important to be able to recover or service a chamber as quickly and efficiently as possible.

Various annealing chambers have been used in the past. In single wafer processing equipment, these annealing chambers typically position the substrate between or on heating and cooling elements, to control the temperature profile of the substrate. However, achieving precise and repeatable temperature profiles can present engineering challenges.

In addition, certain materials, such as copper will rapidly oxidize when exposed to oxygen, at temperatures over about 70° C. If the copper or other material oxidizes, the substrate may no longer be useable, or the oxide layer must first be removed before further processing. These are both unacceptable options in efficient manufacturing. Accordingly, another design factor is to isolate the substrate from oxygen, when the substrate temperature is over about 70° C. Since oxygen is of course present in ambient air, avoiding oxidation of copper during annealing also can present engineering challenges. Improved annealing methods and apparatus are needed.

DETAILED DESCRIPTION OF THE DRAWINGS

Figure 1:
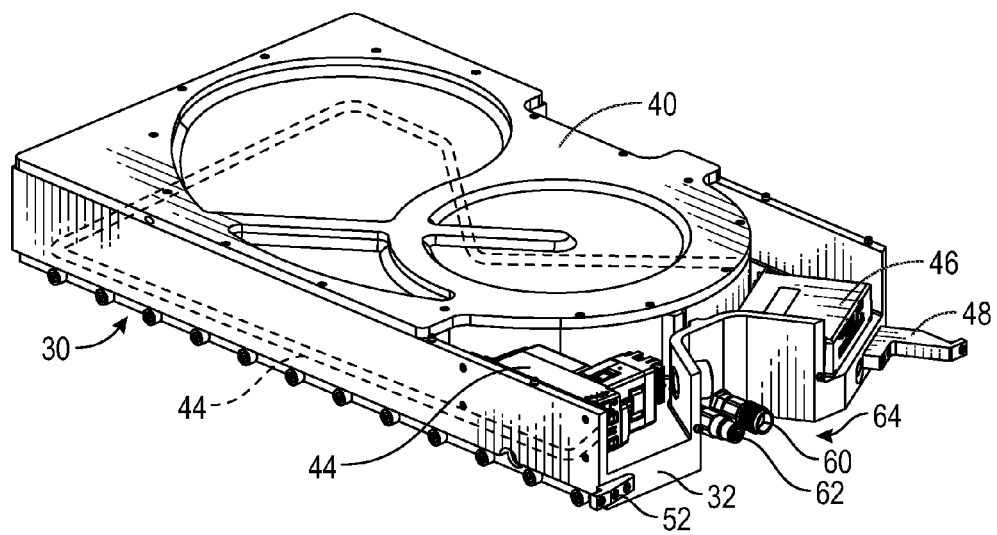
FIG. 1 is a perspective view of an anneal module.
Figure 2A:
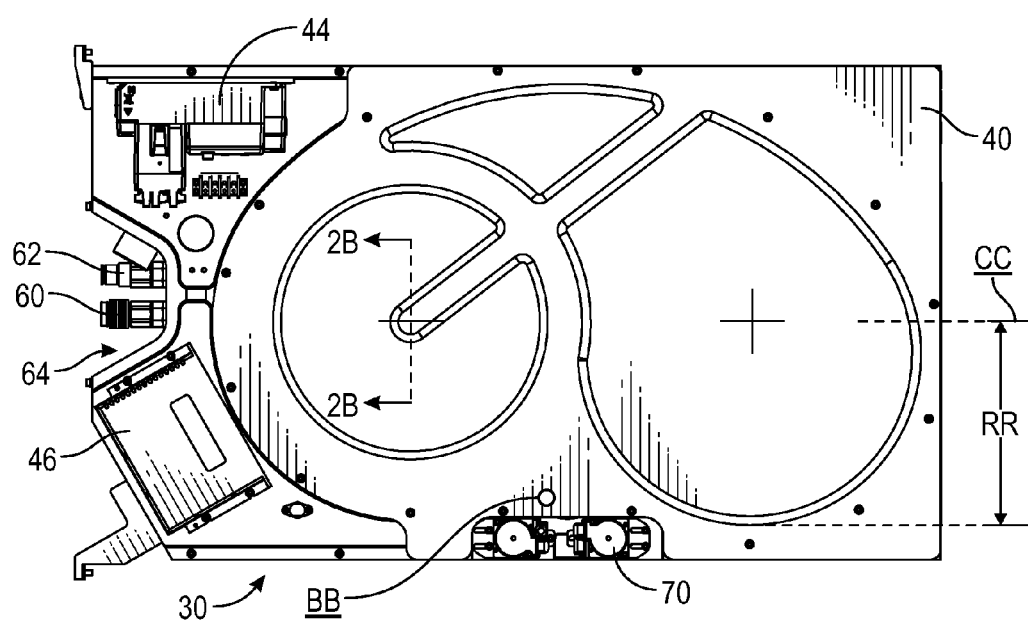
FIG. 2A is a top view of the anneal module shown in FIG. 1.
Figure 2B:
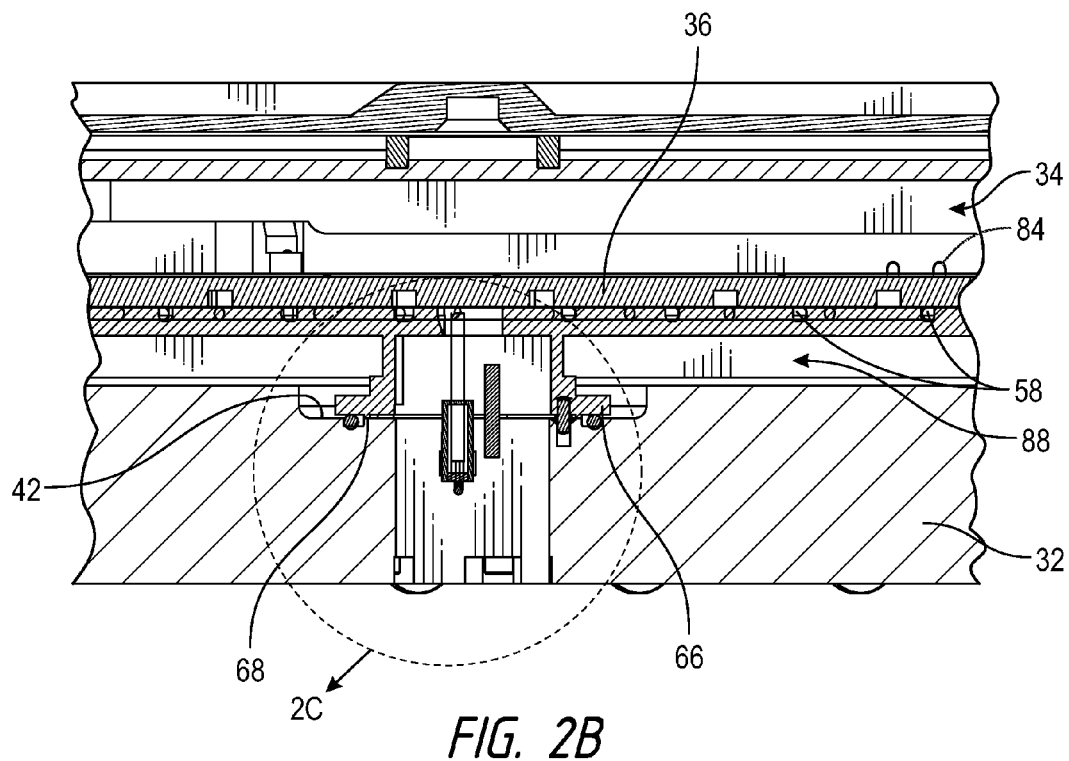
FIG. 2B is a section view taken along line 2B-2B of FIG. 2A.
Figure 2C:
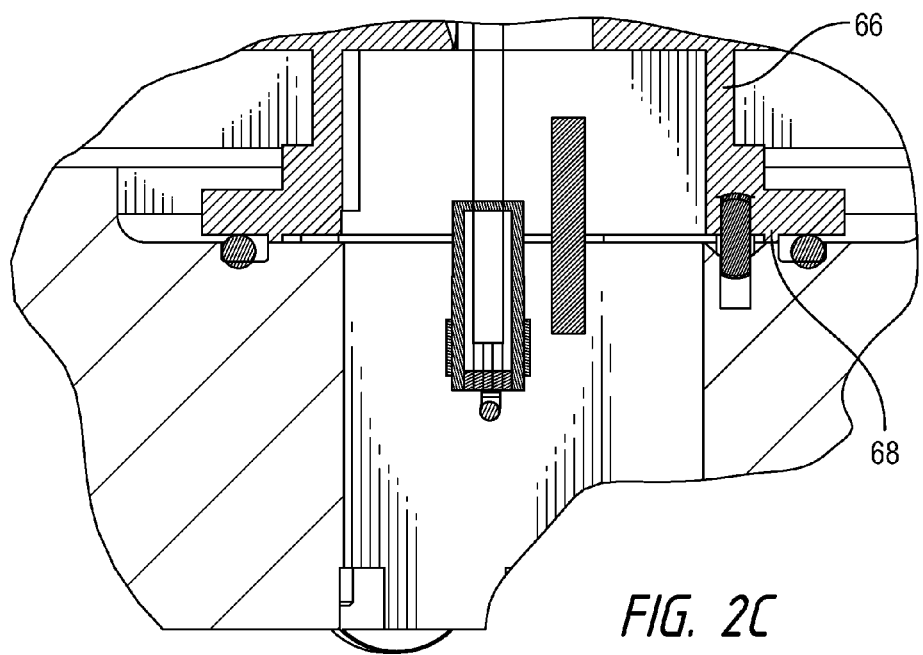
FIG. 2C is an enlarged detail view of the thermal choke shown in FIG. 2B.
Figure 3:
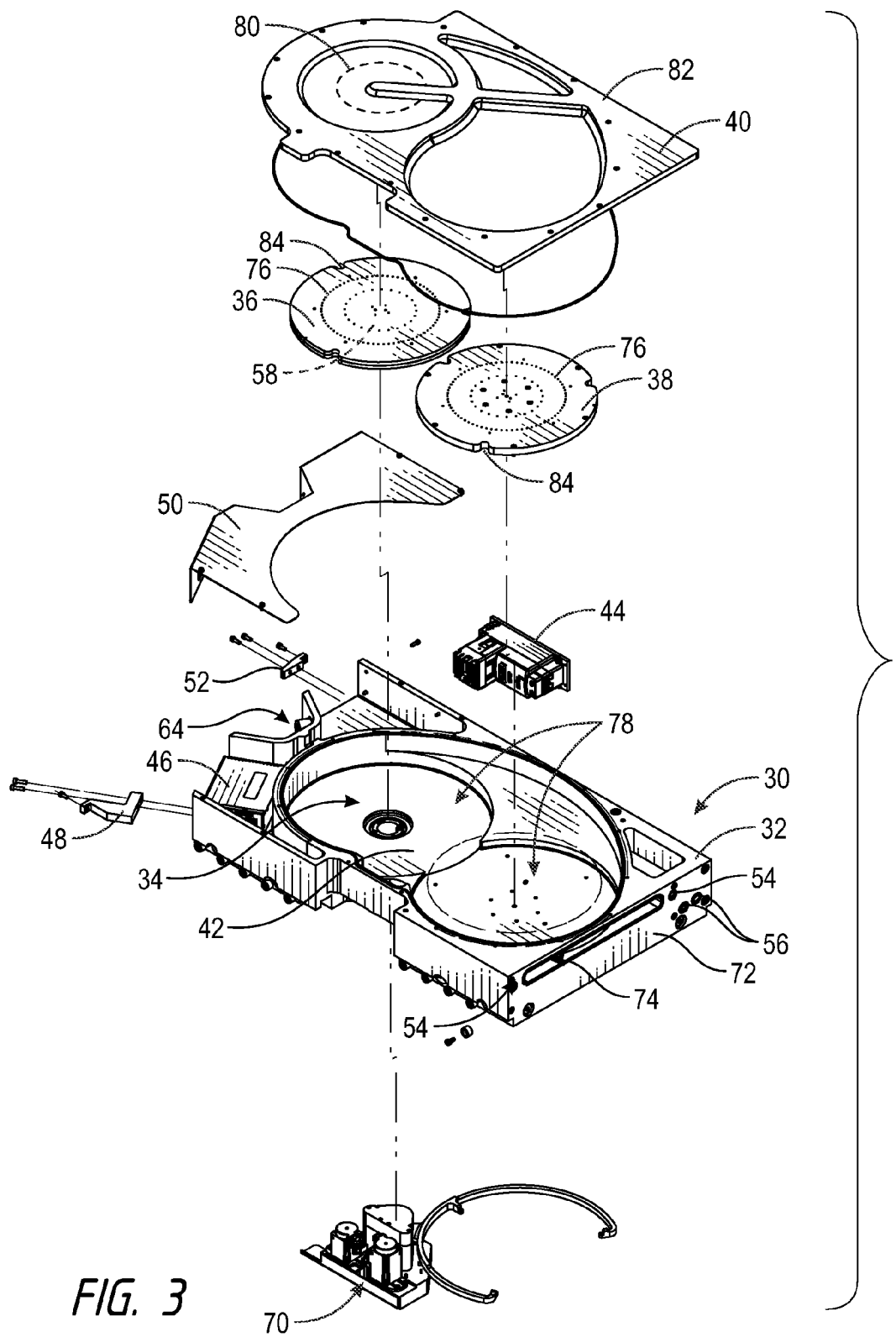
FIG. 3 is an exploded view of the anneal module shown in FIGS. 1 and 2.

As shown in FIGS. 1-3, an anneal module 30 has a body 32 and a lid 40 forming a wafer or substrate chamber 34. The body may be provided as a single cast or otherwise fabricated metal piece, to improve thermal conductivity. A hot plate 36 and a cold plate 38 are attached onto the floor 42 of the body 32. As shown in dotted lines in FIG. 1, the body 32 may include cooling tubes 90 connected to a liquid coolant inlet 60 and a liquid coolant outlet 62. The cooling tubes 90 may be tubes that are cast in place within the body 32. Alternatively the body 32 may be formed of two or more attached sections with the cooling tubes 90 positioned in between sections. As shown in FIG. 1 the coolant inlet 60 and outlet 62 may be located in a fitting recess 64 at the back end of the body 32. In use liquid coolant pumped through the cooling tubes keep the surface temperature of the module 30 near ambient. The cooling tubes may be stainless steel to better resist corrosion.

The top surface of the hot plate 36 may be co-planar with the top surface of the cold plate 38. As shown in FIGS. 2B and 3 a pattern of bumps or risers 76 may be provided on the top surface of each of the plates to better provide uniform support to the wafer, which in turn provides for more uniform and consistent wafer temperature control. The risers 76 may be spheres attached to the top surface of the plate, to hold the wafer 0.2 to 1 mm up off of the plate. The cold plate 38 may be thermally bonded to the floor 42. An electric resistive heater 58 is provided on the bottom side of the hot plate 36, or within the hot plate 36.

As shown in FIGS. 2B and 2C, the hot plate 36 may be supported on a pedestal 66 attached to the floor 42 through a thermal choke 68 which provides only a thin annular ring of contact (e.g. 1-2 mm wide) between the hot plate 36 and the coolant chilled body 32. In this design, as shown in FIG. 2B, the hot plate 36 is spaced apart from the floor via an air or gas gap 88, and contacts the body 32 only through the choke 68. This allows the hot plate 36 to provide sufficient heat for a 500° C. wafer process temperature, without excessively heating the rest of the module 30. Relatively more heat sensitive components of the module, such as seals, are not subjected to high heat. As shown in FIG. 3, the body 32 may have circular recesses 78 to accommodate the hot plate and the cold plate, with the circular recesses 78 adjoining or touching each other, or partially overlapping or intersecting.

As shown in FIG. 2 an electronic servo control unit 44 and a heating control unit 46 may both be included within the anneal module 30 and attached to the body 32. As shown in FIG. 3, the anneal module 30 may have a separate cover 50 over the electronic units 44 and 46, and mounting brackets 48 and 52 for securing the module 30 in place in a higher level assembly as described below. Providing the electronic units 44 and 46 on the body 32 allows for a modular construction and testing of the modules 30. In addition, the body provides conductive cooling of the electronic components, so that fans or convective heat sinks are not needed.

Also as shown in FIG. 3, a load/unload slot 74 is provided in the front end 72 of the anneal module 30. Alignment bushings 54 and gas inlet/outlet ports 56 may also be located on the front end of the anneal module 30. As shown in FIG. 3, the lid 40 includes a showerhead 80 for distributing purge gas above the hot plate 36. The purge gas, which may be an inert gas, such as Nitrogen, or a forming gas, is supplied to the showerhead through a lid gas port 82 connected to a gas supply.

Figure 4:
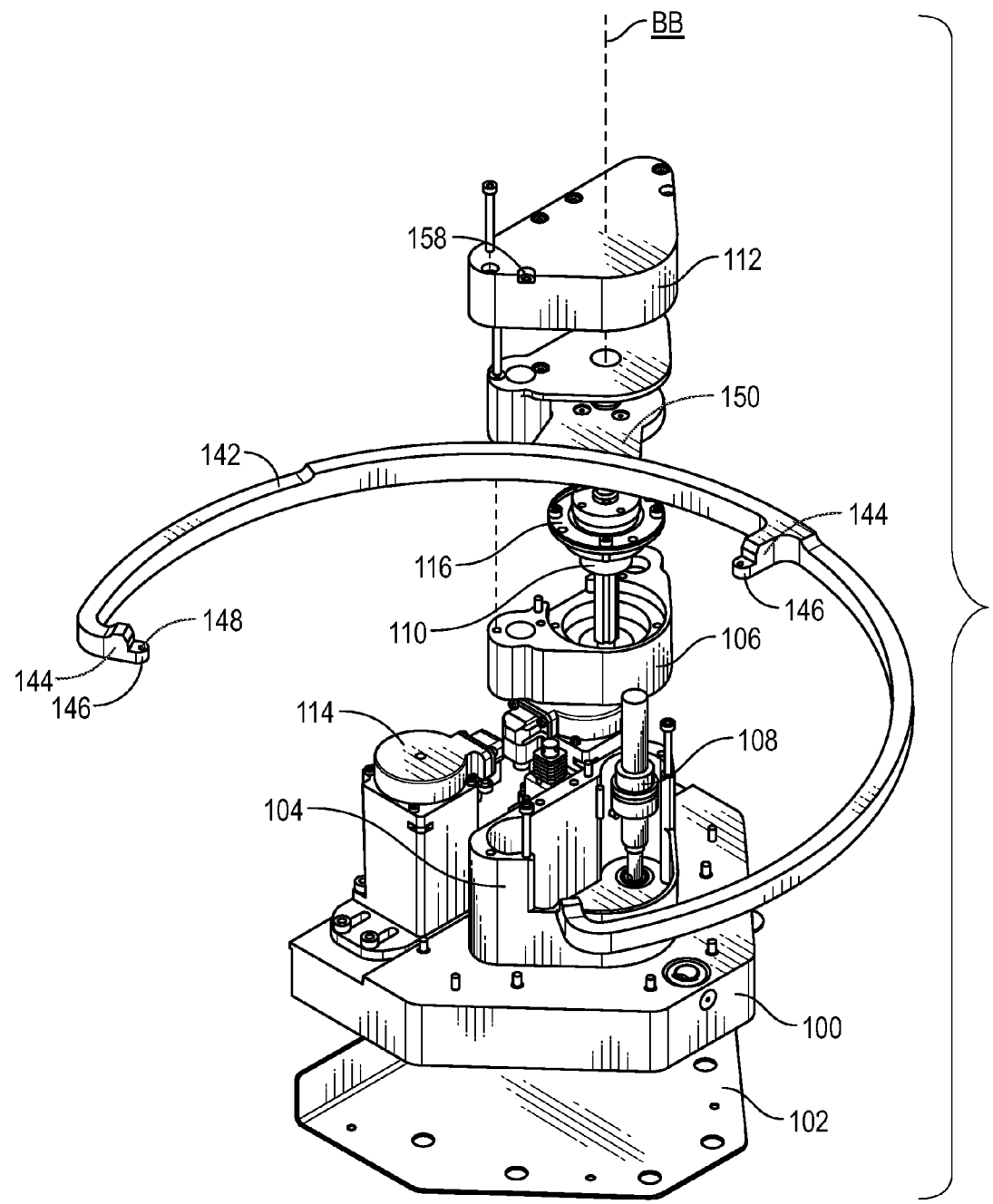
FIG. 4 is an exploded top perspective view of the transfer mechanism shown in FIG. 3.
Figure 5:
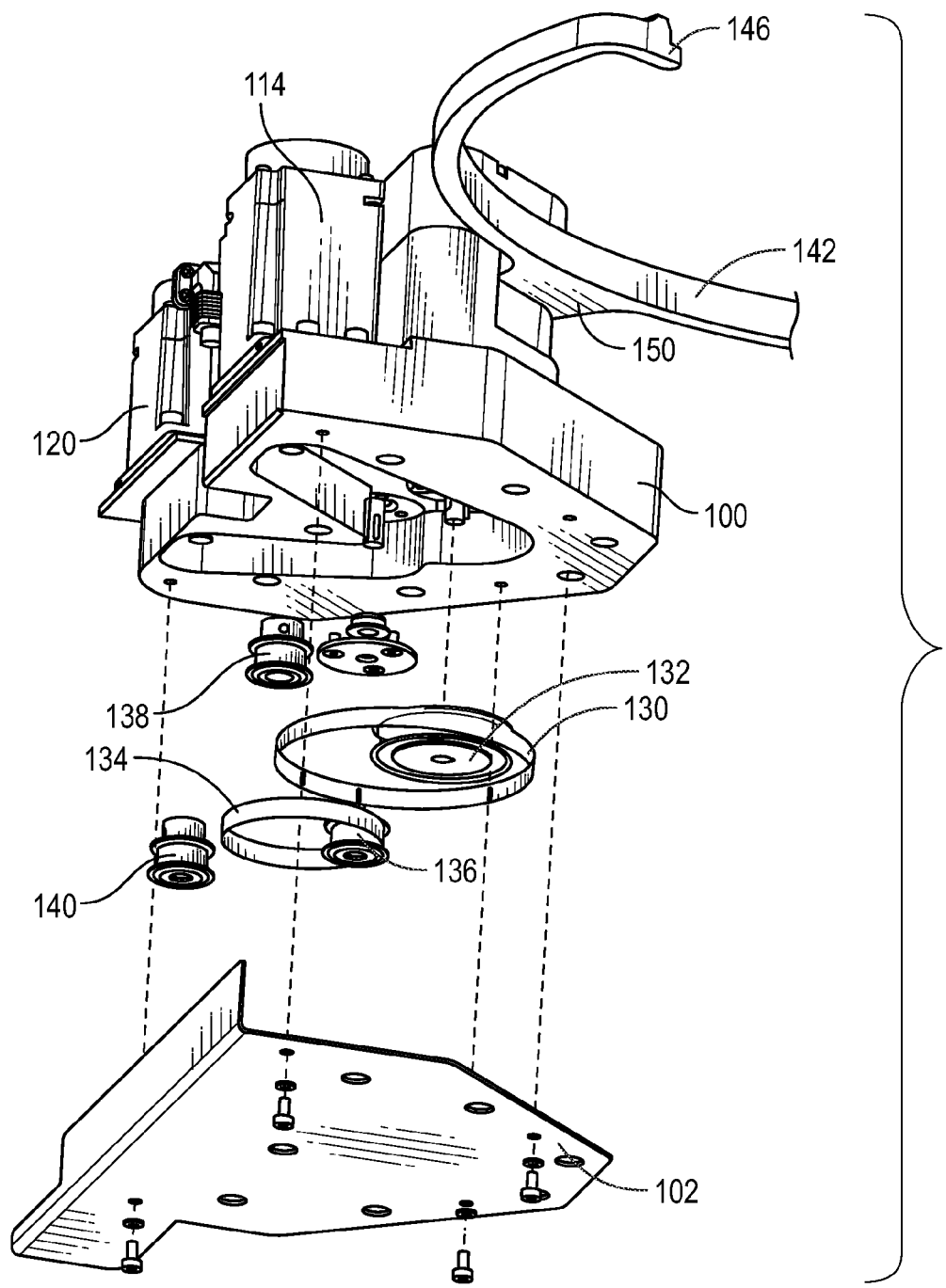
FIG. 5 is an exploded bottom perspective view of the transfer mechanism shown in FIGS. 3 and 4.

Turning now to FIGS. 3-5, a transfer mechanism 70 is provided in the anneal module 30 to move a wafer or substrate from the cold plate 38, which is adjacent to the load/unload slot 74, to the hot plate 36, and then back to the cold plate 38. The transfer mechanism 70 performs a lift, rotate (e.g., about ⅛ turn) and lower movement, to transfer a wafer from the cold plate 38 to the hot plate 36, and vice versa. The transfer mechanism 70 also lifts the wafer to allow handoff of the wafer to a transfer robot. Various designs may be used for this purpose. In the example shown the transfer mechanism may include a coupler 106 in a coupler frame 104 on a base 100. A lead screw 108 is driven by a rotate motor 114, e.g., via a belt 130 turning a sprocket 132 on a lower end of the lead screw 108.

An arm 150 of a hoop 142 is attached to the lead screw 108, so that actuation of the rotation motor 114 causes the hoop 142 to rotate, to position the hoop 142 over either the cold plate 38 or the hot plate 36. A ball spline 110 is linked to a lift motor 120 via a second belt 134 and sprockets 138 and 140, as shown in FIGS. 5-8. Actuation of the lift motor 120 rotates the ball spline 110 which lifts or lowers a spline nut 116, in turn lifting or lowering the hoop 142. A shroud 112 is attached to the coupler 106 and may include a volume exchange channel 158. The use of belts and pulleys provides a 180° gear box to minimize the height of the transfer mechanism 70. The motors 114 and 120 may both be mounted to the base 100 which allows the transfer mechanism 70 to be assembled and pretested before being installed into the module 30.

Referring momentarily back to FIG. 4, the hoop 142 has three or more inwardly projecting fingers 144, with each finger 144 having a ledge 146 with a flat surface 148. In use, as the hoop 142 is raised to lift a wafer off of the hot plate 36 or the cold plate 38, the flat surfaces 148 contact the down facing side of the wafer. Clearance notches 84 may be provided in the hot plate and the cold plate to allow the hoop fingers 148 to move into vertical alignment with, or below, the top surface of the plate 36 or 38.

Figure 6:
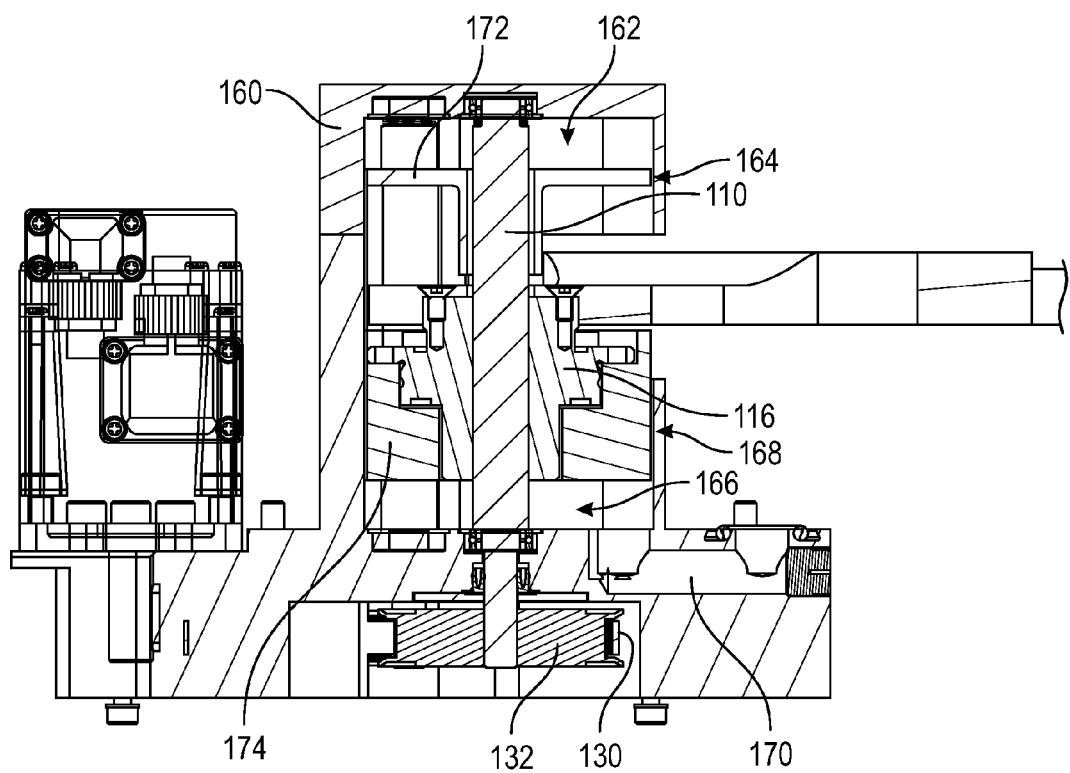
FIG. 6 is a section view of the transfer mechanism shown in FIGS. 3-5.
Figure 7:
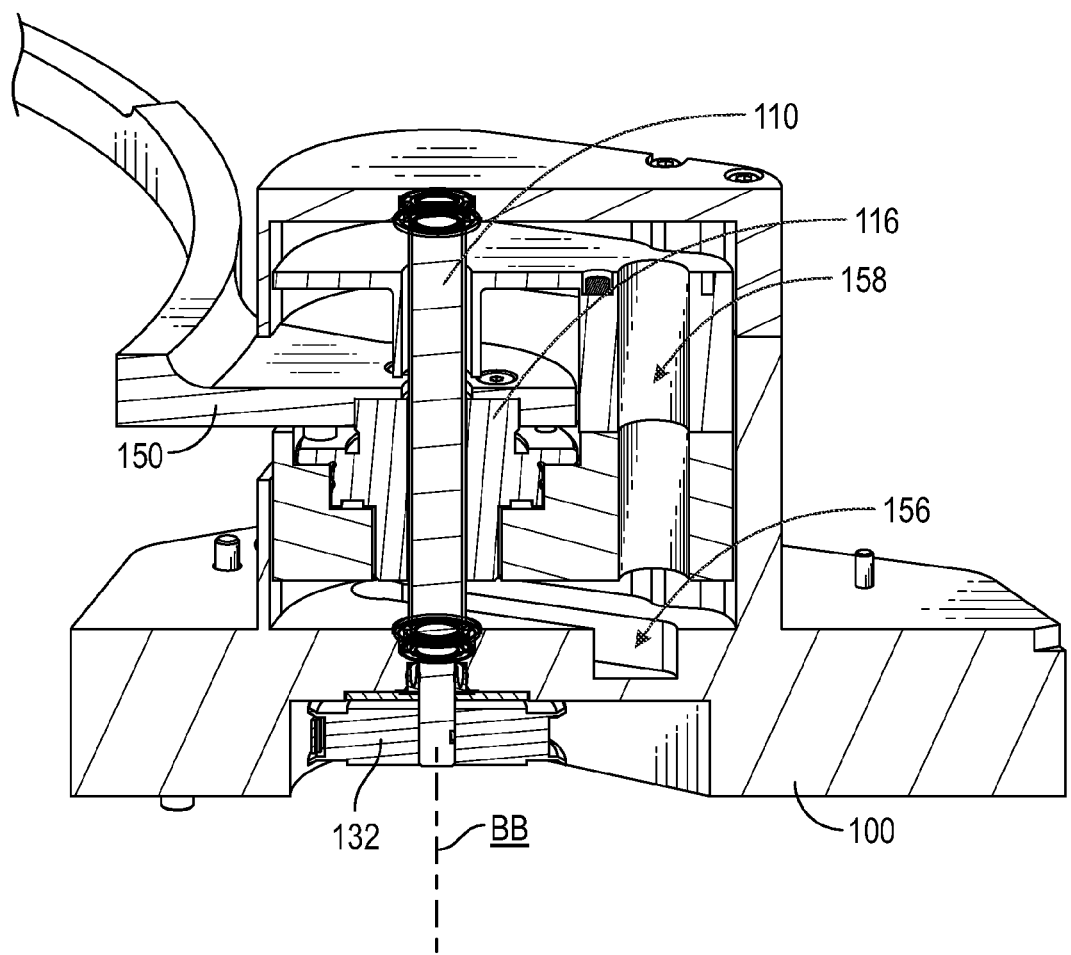
FIGS. 7 and 8 are alternative section views of the transfer mechanism.
Figure 8:
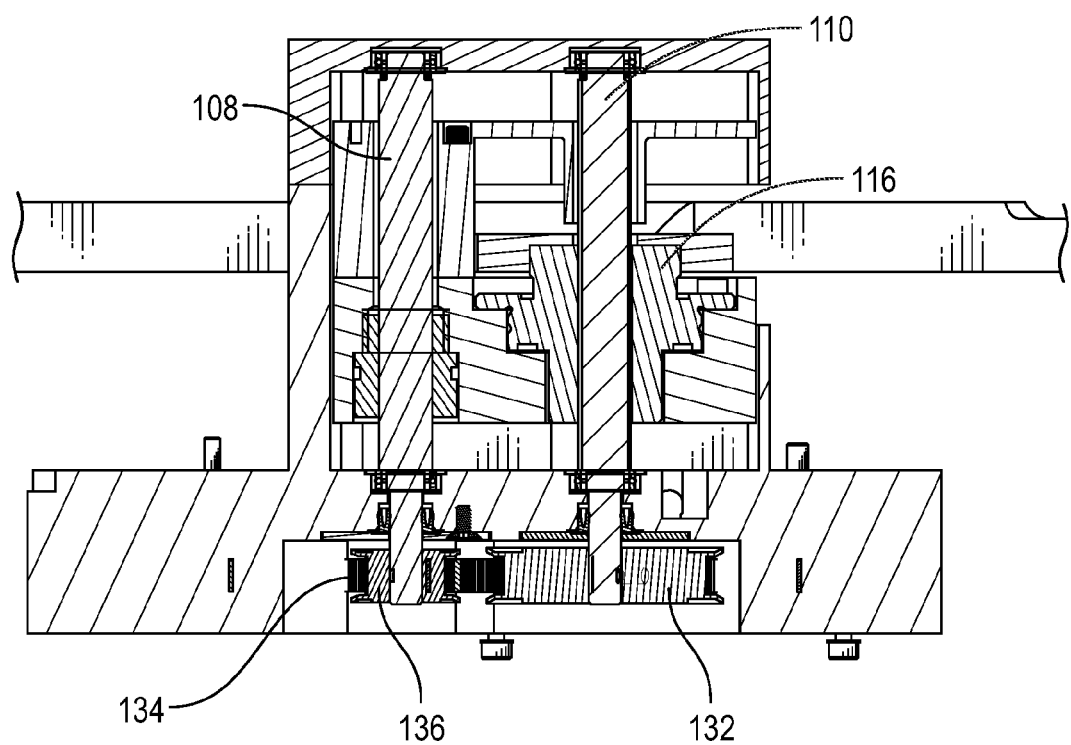

The transfer mechanism 70 minimizes the number of moving or lubricated components in the module 30. These components that are isolated from the process chamber 34 by outer housing 160. An active exhaust system within the housing 160 draws process gas into the transfer mechanism 70. This helps to prevent particles from entering the process chamber 34 where they can cause defects. As shown in FIGS. 6 and 7, this is achieved via an exhaust trench 156 in the base 100, and via the volume exchange channel 158 located between the outer housing 160 and the base 100. A top chamber 162 is formed between an upper shield 172 and the top of the outer housing 160. A top gap 164 allows flow between the top chamber 162 and a bottom gap 168. A bottom chamber 166 is formed between the base 100 and a lower shield 172. As shown in FIG. 6, the bottom gap 168 connects into the bottom chamber 166. Also as shown in FIG. 6, an exhaust port 170 in the base 100 connects into the bottom chamber 162.

The volume exchange channel 158 minimizes any compression of gas in the transfer mechanism housing 160 that is caused by the movement of the components of within the housing. This avoids allowing the gas pressure within the housing 160 to rise above the gas pressure in the process chamber 34, which could allow particles to flow from the transfer mechanism 70 into the process chamber 34 and contaminate the wafer.

Referring to FIG. 2A, the radius of either plate 36 or 38, or the radius of the recesses 78, is shown as dimension RR. The hoop pivot axis shown as BB is spaced apart from the centerline CC of the plates or recesses by a dimension less than RR. This provides for a reduced volume process chamber 34 which reduces gas supply requirements, and also reduces the travel distance of the hoop, allowing for faster wafer movements and reduced particle generation potential.

Figure 9:
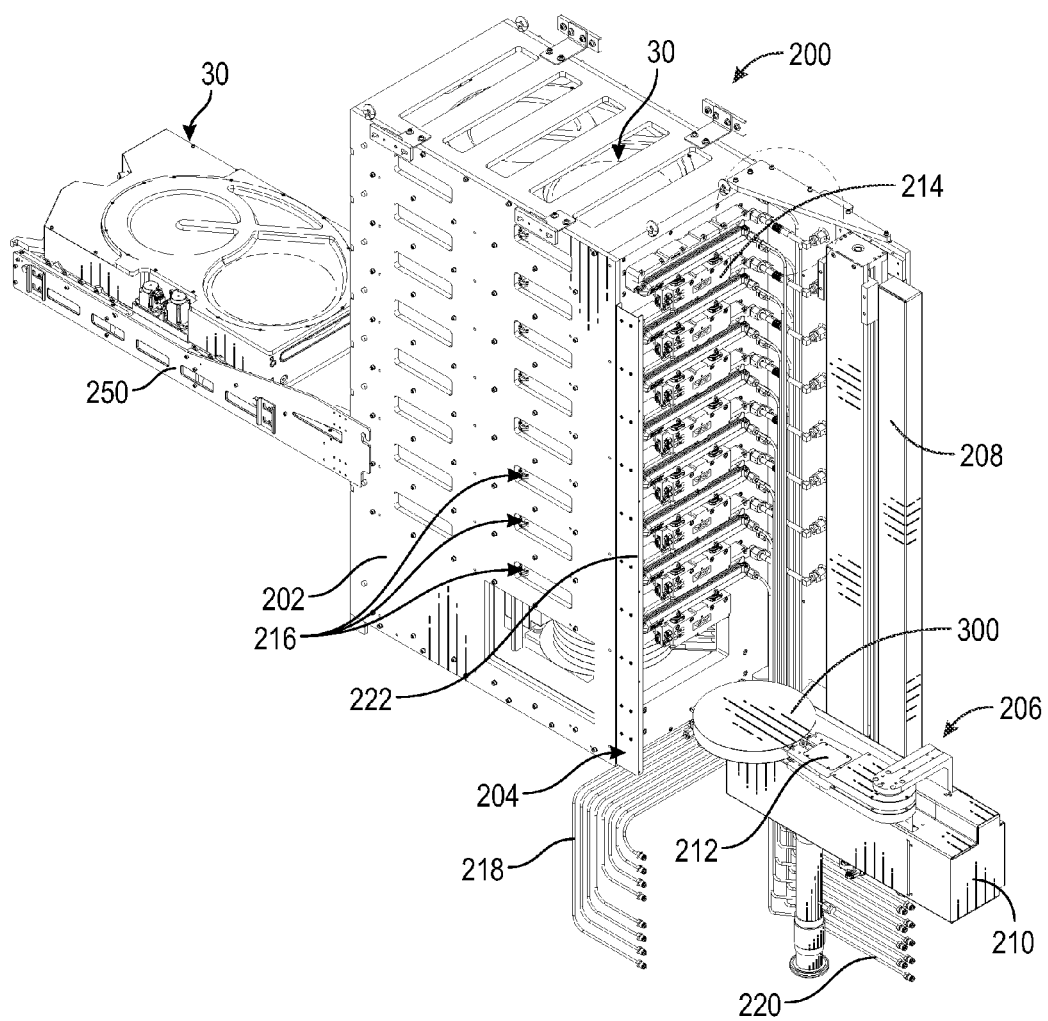
FIG. 9 is a front and top perspective view of an anneal stack assembly holding multiple anneal modules.
Figure 10:
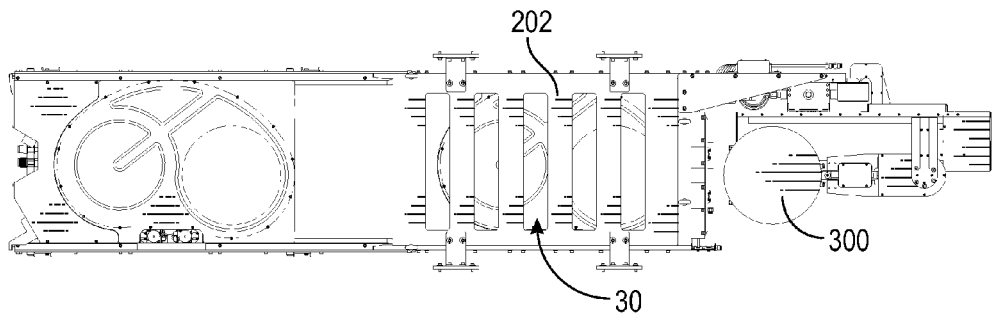
FIG. 10 is a top view of the anneal stack assembly shown in FIG. 9.
Figure 11:
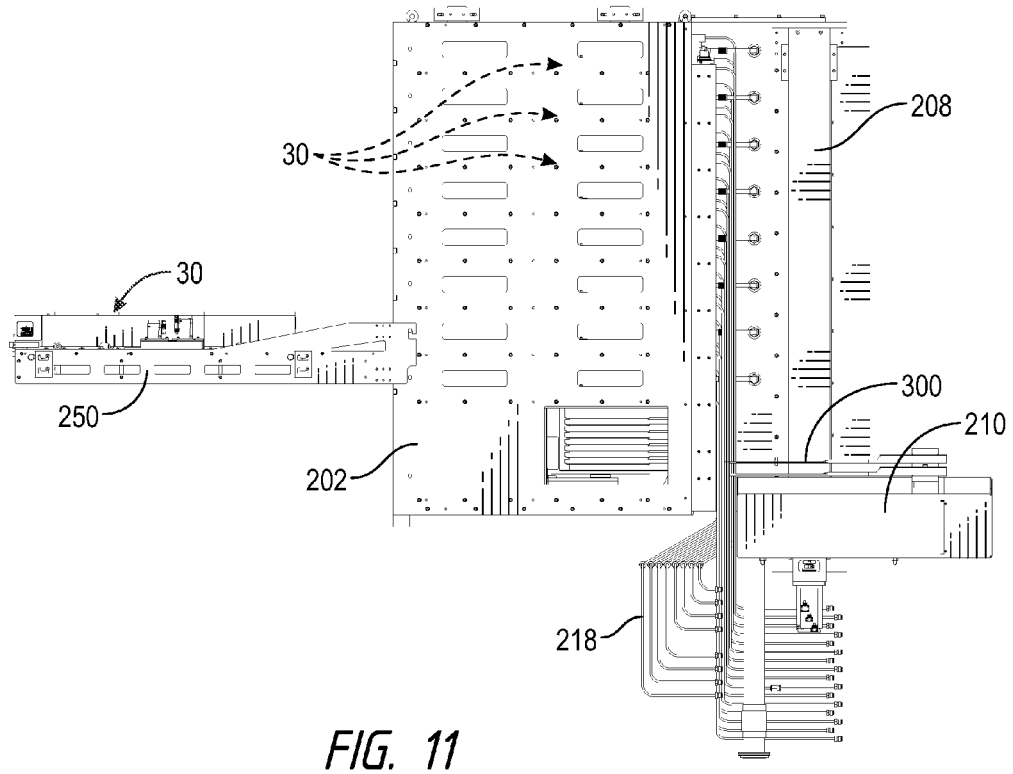
FIG. 11 is a side view of the anneal stack assembly shown in FIGS. 9-10.

Turning now to FIGS. 9-12, multiple anneal modules 30 may be placed into a stack assembly 200, to allow multiple wafers to be annealed simultaneously, within a compact space. As shown in FIGS. 9 and 11, the stack assembly 200 may include a rack 202 divided into vertically stacked separate module slots or spaces 216. A load/unload robot 206 may be provided at a front end 204 of the rack 202. In the example shown the robot 206 includes a track or rail 208 attached to the rack 202. A robot housing 210 having an end effector 212 is movable vertically along the rail 208, so that the end effector may be moved into vertical alignment with a chamber door 214 at each of the module slots 216.

Figure 12:
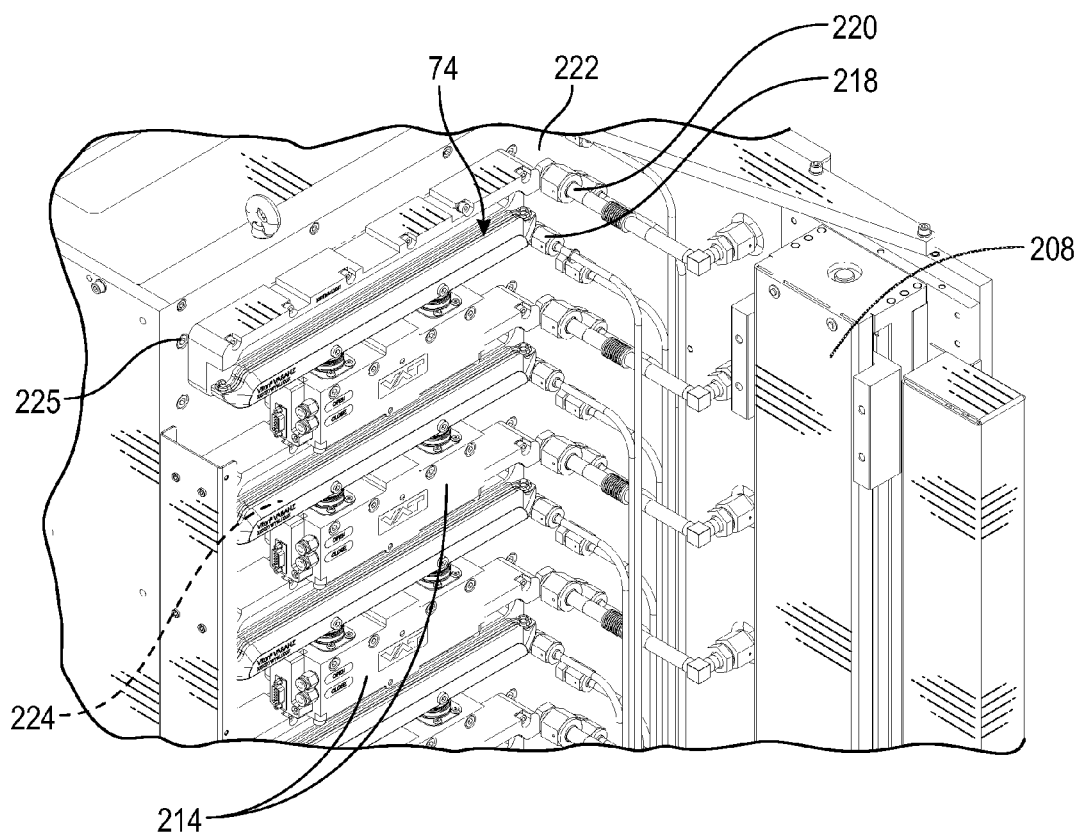
FIG. 12 is an enlarged front perspective view of the anneal stack assembly showing additional features.
Figure 13:
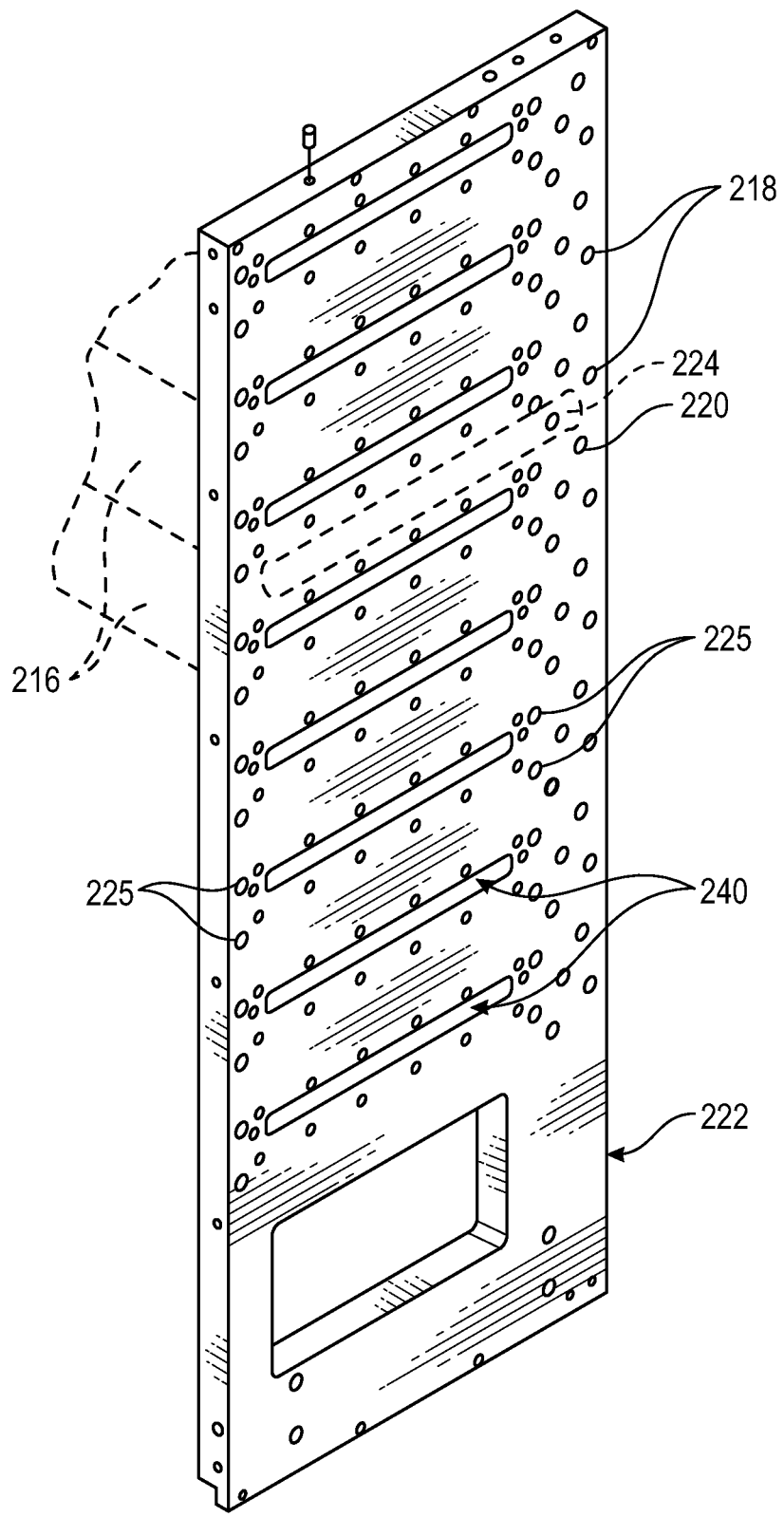
FIG. 13 is a perspective view of the datum plate shown in FIGS. 9 and 12.

As shown in FIGS. 9 and 12, an anneal module 30 may be placed into each of the module slots 216, in the example shown, eight anneal modules 30 are vertically stacked in the stack assembly 200. The body 32 of each anneal module 30 may be bolted onto a datum plate 222. Gas inlet lines 218 and gas outlet or exhaust lines 220 may be connected to fittings on the datum plate 222. Gas supplied through the datum plate 222 can be used to isolate the process chamber 34 from its environment, to better avoid contamination. Sealed interfaces between the datum plate 222 and the chamber body 32 maintain gas flow through the process chamber 34.

As shown in FIGS. 12-16, the modules 30 may be attached to the datum plate 222 via bolts passing through mounting holes 225 in the datum plate, with pins on the back side of the datum plate used to more precisely position the modules 30 on the datum plate. Gas seals on the gas ports 56 on the front of the module 30 seal against the back surface of the datum plate. The datum plate is sufficiently rigid (e.g., a 3-12 or 4-10 mm thick metal plate) to securely support and position the modules. The number of connections between anneal module 30 and the stack assembly 200 is reduced to allow quick removal and service of the anneal modules 30 from the stack assembly 200. A service rack 250 may be attached onto the back end of the rack 202, for holding an anneal module 30 during servicing.

As shown in FIGS. 13-16, each module slot or position 216, a plate slot 240 in the datum plate 222 aligns with the load slot 74 in the front end of the module 30. An exhaust plenum 224 may be provided in the datum plate 222 at each module position 216. The exhaust plenum 224 may be drilled into the datum plate 222, from one side of the plate, with the exhaust plenum adjacent and parallel to an upper or lower edge of each plate slot 240. The exhaust plenum is aligned with the plate slot 240 to exhaust gas from the process chamber 34, via the exhaust lines 220.

Figure 17:
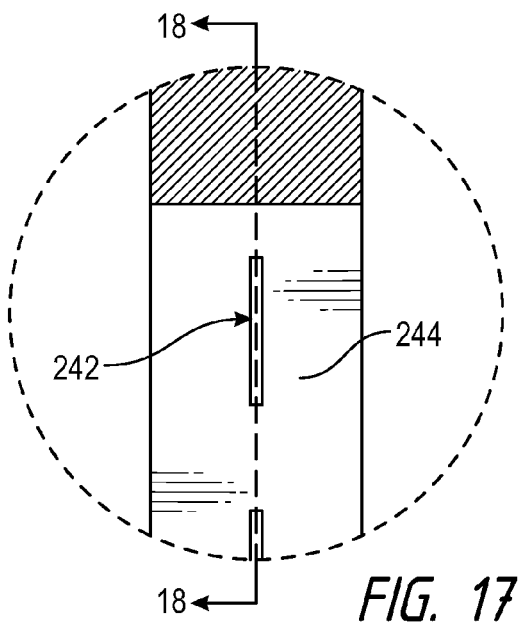
FIG. 17 is an enlarged view of one of the slots shown in FIG. 16.
Figure 18:
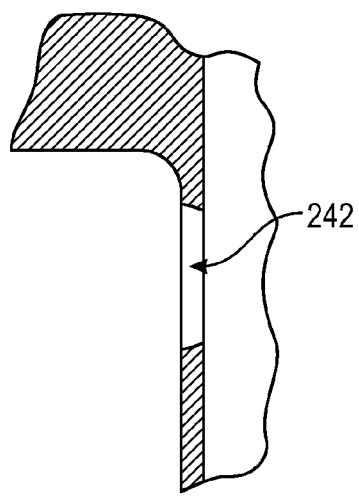
FIG. 18 is a view taken along line 18-18 of FIG. 17.

As shown in FIGS. 15-18, this may be achieved via exhaust slot segments 242 extending from the exhaust plenum 224 to the plate slot 240, at each module position 216. The exhaust slot segments may be cut through the down facing surface 244 of each plate slot 240, for example by positioning a circular blade cutting tool or mill, having a diameter nominally smaller than the slot height HH in FIG. 15, and then moving the cutter up to create arcuate opening leading into the exhaust plenum, as shown in FIGS. 17 and 18.

In use the exhaust slot segments 242 lead into the exhaust plenum 224 which may be connected to a vacuum source. When the module door 214 is closed during processing, gaps may exist around the door 214, so that the module 30 is not sealed. The vacuum drawn through the exhaust slot segments 242 at each plate slot 240 largely prevents ambient air from entering into the module 30. When the door is open, during load and unload, gas flows out of the module 30 through the module slot 74 and the plate slot 240, if the interior of the module is maintained at a gas pressure higher than ambient. The size of the exhaust slot segments 242 may vary along the length of the plate slot 240, with the slot segments 242 further upstream from the vacuum source larger than the slot segments 242 closer to the vacuum source, to provide a substantially uniform draw or gas intake across the length of the plate slot 240. For example, the slot segments closer to the vacuum source, i.e., closer to the top of FIG. 15, may be 1 mm wide and 20-40 mm long, with the slot segments closer to the bottom of FIG. 15 made wider or longer.

Figure 14:
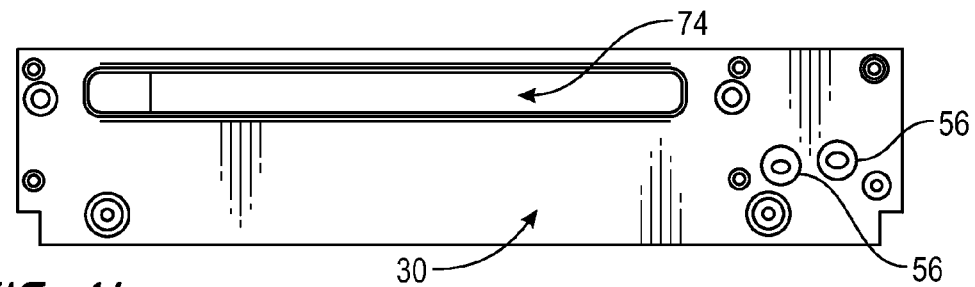
FIG. 14 is a front view of the module shown in FIG. 1.
Figure 15:
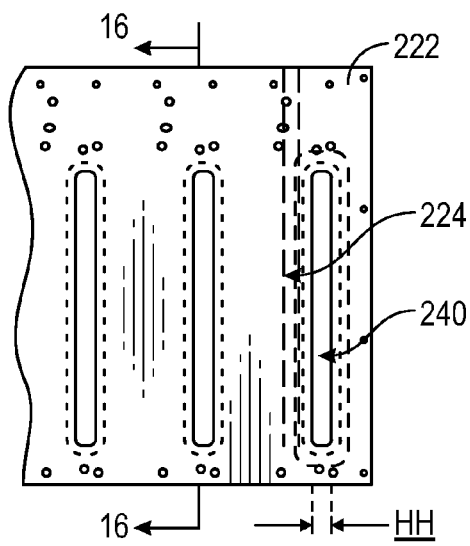
FIG. 15 is front view of the datum plate shown in FIG. 13.
Figure 16:
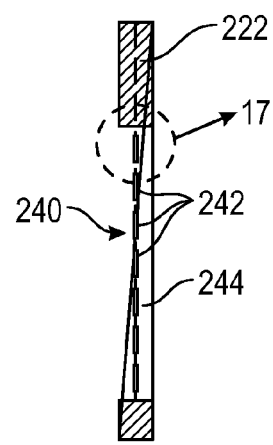
FIG. 16 is a view taken along line 16-16 of FIG. 15.

As shown in FIG. 14, the number of gas ports 56 provided may vary depending on the specific anneal process performed by the module 30. For example, two helium gas ports 56 may be used, to separately provide helium to the hot plate 36 and to the cold plate 38. One or more other inert gas ports 56 may be used to supply nitrogen into the module. An additional gas port 56 may supply hydrogen, to that a forming gas may be used within the module. Separate gas supply and exhaust ports may also be routed directly to the transfer mechanism, to better reduce potential for contamination.

The anneal module 30 may be used with or without the stack assembly 200. When used in the stack assembly 200, the robot 206 is actuated to carry a wafer 300 on the end effector 212 into alignment with one of the anneal modules 30 in the stack assembly 200. The chamber door 214 is opened. The robot 206 advances the end effector 212 and the wafer 300 into the process chamber 34 and sets the wafer down onto the hoop 142 of the transfer mechanism 70. Typically at this step the hoop 142 is in a raised up above the cold plate 38, so that the end effector 212 moves down and sets the wafer 300 onto the ledges 146 of the hoop 142. Alternatively, if the hoop is in a down position, then the wafer 300 may be set down directly onto the cold plate 38.

With the wafer 300 now held by the hoop 142, the transfer mechanism is actuated to rotate the hoop by about a ⅛ turn, moving the wafer 300 over the hot plate 36. In some methods, the heater 58 may operate continuously with the hot plate 36 correspondingly staying at a desired steady state temperature. In other methods the heater 58 may be cycled, or turned on only upon imminent delivery of a wafer. The transfer mechanism 70 lowers the hoop 142 so that the bottom surface of the wafer comes to rest on the risers 76 on the top surface of the hot plate 36. Gas is cycled through the chamber 34 with the gas pressure within the chamber remaining positive relative to ambient. This helps to exclude oxygen and contaminant particles from the chamber 34.

The wafer 300 may remain on the hot plate 36 for a specific dwell time. The transfer mechanism 70 is then again actuated to lift the wafer 300 up off of the hot plate and rotate the hoop 142 back to the initial position over the cold plate 38. The transfer mechanism 70 then lowers the wafer onto the cold plate 38, with the wafer supported on the risers 76 on the top surface of the cold plate 38. Chilled liquid is pumped through the cooling tubes 90 to cool the cold plate and the base 32. After the wafer is sufficiently cooled, the wafer may be lifted up off of the cold plate via the hoop 142 for handoff back to the robot 206. The chamber door 214 is opened and the end effector 212 extended into the chamber 34, below the hoop 142. The end effector 212 may then be lifted, or the hoop 142 lowered, to complete the handoff. The robot 206 then moves the annealed wafer 300 to a subsequent station, and may proceed to deliver another wafer to the anneal chamber 30 for processing.

The module 30 may be designed to provide oxygen levels of less than 100 ppm when the door 214 is closed during processing. Gas flow in the chamber 34 may be optimized to sweep across the whole chamber. The showerhead 80 may have gas ports optimized in spacing and orifice size to enhance wafer temperature uniformity. The exhaust plenum 224 may be located just behind the door 214 at the farthest point from the hot plate 36 and the gas is exhausted through a series of slots across the chamber entrance. The slot size may be optimized to ensure even gas flow across the chamber. The flow and internal chamber geometry can be designed to minimize the time required to evacuate any oxygen in the chamber either at startup or after transfer robot handoff. For example the chamber volume is minimized and deep corners or pockets that may take longer to purge are eliminated. The flow exit paths are restricted to slightly pressurize the chamber above atmospheric pressure to avoid oxygen infiltration into the chamber whether the door is opened or closed.

Thus, novel apparatus and methods have been shown and described. Various changes and modifications may be made without departing from the spirit and scope of the invention. The invention, therefore, should not be limited, except by the following claims and their equivalents.

The invention claimed is:

1. An anneal apparatus comprising:
   a metal body;
   a lid on the metal body with a process chamber formed between the metal body and the lid;
   one or more cooling lines in or on the metal body;
   a hot plate having a pedestal supported on a thermal choke on the body;
   a gas distributor in the lid over the hot plate;
   a cold plate on the metal body;
   a load slot in the metal body adjacent to the cold plate;
   a transfer mechanism having a hoop movable to a first position over the cold plate and to a second position over the hot plate, with the transfer mechanism also having a lifter for lifting and lowering the hoop, with the lifter including a ball spline enclosed in a housing, and a spline nut attached to the hoop;
   a volume exchange channel connecting upper and lower chambers in the housing; and
   at least one electronic assembly attached to the metal body.

2. The apparatus of claim 1 with the thermal choke comprising a raised ring having a width of less than 2 mm.

3. The apparatus of claim 1 with an upper surface of the hot plate and an upper surface of the cold plate in a common plane.

4. The apparatus of claim 3 with the hot plate in a first circular recess in the body and the cold plate in a second circular recess in the body, and with the first circular recess intersecting the second circular recess.

5. The apparatus of claim 1 comprising first and second electronic assemblies on the body, with the first electronic assembly controlling the transfer mechanism and with the second electronic assembly controlling a heater in the hot plate.

6. The apparatus of claim 5 with the electronic assemblies on a first side of the hot plate and with the cold plate on a second side of the hot plate opposite from the first side.

7. The apparatus of claim 1 with the transfer mechanism having a lift motor and a rotate motor linked to the hoop adapted to fit over the hot plate and the cold plate.

8. The apparatus of claim 7 with the transfer mechanism further including a lift belt linking the lift motor to the hoop and a rotate belt linking the rotate motor to the hoop.

9. The apparatus of claim 7 further including a lead screw in the housing linked to the rotate motor.

10. The apparatus of claim 1 with the housing attached to a base and further including an exhaust port in the base connecting into the lower chamber.

11. The apparatus of claim 1 with the hot plate having a first radius and the cold plate having a second radius, and the hoop having an axis of rotation spaced apart from a centerline of the plates by a dimension less than the first radius and less than the second radius.

12. An anneal apparatus comprising:
a metal body;
one or more cooling lines in or on the metal body;
first and second circular recesses in the metal body;
a hot plate in the first circular recess and a cold plate in the second circular recess in the body, with the first circular recess intersecting the second circular recess;
a pedestal on the hot plate supported on a thermal choke on the body;
one or more electronic assemblies on the body electrically connected to the transfer mechanism and to a heater in the hot plate;
a lid on the metal body with a process chamber formed between the metal body and the lid;
a gas distributor in the lid over the hot plate;
a load slot in the metal body adjacent to the cold plate; and
a transfer mechanism having a hoop movable to a first position over the cold plate and to a second position over the hot plate, with the transfer mechanism also having a lifter for lifting and lowering the hoop.

13. The apparatus of claim 12 with the transfer mechanism having a housing enclosing a ball spline and a spline nut attached to the hoop, and a lift motor and a rotate motor linked to the hoop.

14. The apparatus of claim 12 with the electronic assembly on a first side of the hot plate and with the cold plate on a second side of the hot plate opposite from the first side.

15. The apparatus of claim 12 with the transfer mechanism having a housing attached to a base, upper and lower chambers with the housing, and an exhaust port in the base connecting into the lower chamber.

16. The apparatus of claim 12 with the hoop having an axis of rotation spaced apart from a centerline of the plates by a dimension less than the radius of either plate.

17. An anneal apparatus comprising:
a metal body;
a lid on the metal body with a process chamber formed between the metal body and the lid;
one or more cooling lines in or on the metal body;
a hot plate having a pedestal supported on a thermal choke on the body;
a gas distributor in the lid over the hot plate;
a cold plate on the metal body, with the hot plate having a first radius and the cold plate having a second radius;
a load slot in the metal body adjacent to the cold plate;
a transfer mechanism having a hoop movable to a first position over the cold plate and to a second position over the hot plate, with the hoop having an axis of rotation spaced apart from a centerline of the hot and cold plates by a dimension less than the first radius and less than the second radius, and further including a lifter for lifting and lowering the hoop; and
at least one electronic assembly attached to the metal body.

18. The apparatus of claim 17 with the thermal choke comprising a raised ring having a width of less than 2 mm.

19. The apparatus of claim 17 with an upper surface of the hot plate and an upper surface of the cold plate in a common plane, the hot plate in a first circular recess in the metal body and the cold plate in a second circular recess in the metal body, and with the first circular recess intersecting the second circular recess.

20. The apparatus of claim 17 with the transfer mechanism having a housing enclosing a ball spline and a spline nut attached to the hoop, and a volume exchange channel connecting upper and lower chambers in the housing.

* * * * *